(12) United States Patent
Nishimura

(10) Patent No.: US 12,356,847 B2
(45) Date of Patent: Jul. 8, 2025

(54) FLEXIBLE PANEL

(71) Applicant: Japan Display Inc., Tokyo (JP)

(72) Inventor: Masumi Nishimura, Minato-ku (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/906,230

(22) Filed: Oct. 4, 2024

(65) Prior Publication Data
US 2025/0031564 A1 Jan. 23, 2025

Related U.S. Application Data

(63) Continuation of application No. 18/515,402, filed on Nov. 21, 2023, now Pat. No. 12,144,240, which is a
(Continued)

(30) Foreign Application Priority Data

Nov. 11, 2016 (JP) .................................. 2016-220147

(51) Int. Cl.
*H10K 77/10* (2023.01)
*H01R 12/62* (2011.01)
(Continued)

(52) U.S. Cl.
CPC ........... *H10K 77/111* (2023.02); *H01R 12/62* (2013.01); *H10K 50/805* (2023.02);
(Continued)

(58) Field of Classification Search
CPC ............... H10K 77/111; H10K 59/131; H10K 2102/311
See application file for complete search history.

(56) References Cited

U.S. PATENT DOCUMENTS 9,812,659 B2   11/2017   Kwon et al.
9,977,466 B2    5/2018   Kwon et al.
(Continued)

FOREIGN PATENT DOCUMENTS

JP   2014197181 A   10/2014
JP   2016031499 A    3/2016

OTHER PUBLICATIONS

Japanese Office Action issued Oct. 13, 2020 in Japanese Patent Application No. 2016-220147 (with unedited computer generated English translation), 8 pages.

*Primary Examiner* — Karabi Guharay
(74) *Attorney, Agent, or Firm* — Maier & Maier, PLLC

(57) ABSTRACT

In a display device including a flexible display panel, the risk of disconnection of a wiring due to bending is reduced. A display panel includes a display function layer including display elements and a wiring on one major surface of a base material having flexibility. The display panel includes, on the one major surface of the base material, an organic-film-covered wiring area where the surface of the wiring is covered with an organic planarization film that is an organic insulating film in direct contact with the wiring. The display panel includes, in the plane thereof, a display area where the display elements are arranged and a component mounting area that is a peripheral area located outside the display area. As the organic-film-covered wiring area, a curved area is provided in the peripheral area.

4 Claims, 7 Drawing Sheets

Related U.S. Application Data continuation of application No. 18/160,410, filed on Jan. 27, 2023, now Pat. No. 11,864,457, which is a continuation of application No. 17/731,296, filed on Apr. 28, 2022, now Pat. No. 11,569,465, which is a continuation of application No. 17/314,443, filed on May 7, 2021, now Pat. No. 11,349,090, which is a continuation of application No. 16/520,962, filed on Jul. 24, 2019, now Pat. No. 11,031,564, which is a continuation of application No. 16/141,298, filed on Sep. 25, 2018, now Pat. No. 10,403,835, which is a continuation of application No. 15/961,409, filed on Apr. 24, 2018, now Pat. No. 10,115,914, which is a continuation of application No. 15/792,904, filed on Oct. 25, 2017, now Pat. No. 9,997,730.

(51) Int. Cl.

| | | |
|---|---|---|
| *H10K 50/805* | (2023.01) | |
| *H10K 50/814* | (2023.01) | |
| *H10K 50/824* | (2023.01) | |
| *H10K 50/84* | (2023.01) | |
| *H10K 50/844* | (2023.01) | |
| *H10K 59/122* | (2023.01) | |
| *H10K 59/125* | (2023.01) | |
| *H10K 59/131* | (2023.01) | |
| *H10K 59/80* | (2023.01) | |
| *H10K 102/00* | (2023.01) | |

(52) U.S. Cl.
CPC ......... *H10K 50/814* (2023.02); *H10K 50/824* (2023.02); *H10K 50/84* (2023.02); *H10K 50/844* (2023.02); *H10K 59/122* (2023.02); *H10K 59/125* (2023.02); *H10K 59/131* (2023.02); *H10K 59/873* (2023.02); *H10K 2102/00* (2023.02); *H10K 2102/311* (2023.02); *H10K 2102/351* (2023.02); *Y02E 10/549* (2013.01)

(56) References Cited

U.S. PATENT DOCUMENTS

| | | | |
|---|---|---|---|
| 11,013,108 B2 | 5/2021 | Kim et al. | |
| 11,031,564 B2 * | 6/2021 | Nishimura | H10K 59/873 |
| 11,264,579 B2 | 3/2022 | Zheng | |
| 11,569,465 B2 * | 1/2023 | Nishimura | H10K 59/122 |
| 11,864,457 B2 * | 1/2024 | Nishimura | H10K 59/131 |
| 12,144,240 B2 * | 11/2024 | Nishimura | H10K 50/844 |
| 2006/0119778 A1 | 6/2006 | Oda et al. | |
| 2007/0153208 A1 | 7/2007 | Sakaguchi et al. | |
| 2016/0174304 A1 | 6/2016 | Kim et al. | |
| 2016/0308151 A1 | 10/2016 | Kim et al. | |
| 2018/0081399 A1 | 3/2018 | Kwon et al. | |
| 2018/0123060 A1 | 5/2018 | Jang et al. | |

\* cited by examiner

1

FLEXIBLE PANEL

CROSS-REFERENCE TO RELATED APPLICATION

The present application is a continuation of U.S. application Ser. No. 18/515,402 filed Nov. 21, 2023, now Patent No. 12,14442,240, which is a continuation of Ser. No. 18/160,410 filed Jan. 27, 2023, now U.S. Pat. No. 11,864,457, which is a continuation of Ser. No. 17/731,296 filed Apr. 28. 2022, now U.S. Pat. No. 11,569,465, which is a continuation of U.S. application Ser. No. 17/314,443 filed May 7, 2021, now U.S. Pat. No. 11,349,090, which is a continuation of U.S. application Ser. No. 16/520,962, filed Jul. 24, 2019, now U.S. Pat. No. 11,031,564, which is a continuation of U.S. application Ser. No. 16/141,298, filed Sep. 25, 2018, now U.S. Pat. No. 10,403,835, which is a continuation of U.S. Application Ser. No. 15/961,409, filed Apr. 24, 2018, now U.S. Pat. No. 10,115,914, which is a continuation of U.S. application Ser. No. 15/792,904, filed Oct. 25, 2017, now U.S. Pat. No. 9,997,730, which claims priority from Japanese application JP2016-220147 filed on Nov. 11, 2016. The entire contents of each of the above-identified applications are incorporated herein by reference.

BACKGROUND OF THE INVENTION

1. Field of the Invention

The present invention relates to a display device.

2. Description of the Related Art

A flat panel display such as an organic electroluminescent (EL) display device includes a display panel in which thin film transistors (TFTs), organic light-emitting diodes (OLEDs), and the like are formed on a base material. A glass substrate has been conventionally used for the base material of the display panel; however, the development of a flexible display in which a resin film or the like such as a polyimide film is used as the base material to enable bending of the display panel has recently progressed.

As the applications of the flexible display, it is considered to achieve a narrower picture-frame by folding a portion of the display panel that is provided on the outside of an image display area thereof and mounted with an integrated circuit (IC) or a flexible printed circuit (FPC) onto the rear side of the display area.

SUMMARY OF THE INVENTION

In the display panel, wirings are formed, in addition to display elements, on the base material such as a resin film, and the surface of the wiring is covered with an inorganic insulating film. Here, in the flexible display panel, the risk of disconnection of the wiring is increased due to stress associated with bending.

The invention reduces the risk of disconnection of a wiring due to bending in a display device including a flexible display panel.

An aspect of the invention is directed to a display device comprising a display panel with a base material having flexibility and a display function layer, wherein the display function layer includes display elements and a wiring and located above one major surface of the base material, the display panel has an organic-film-covered wiring area where a surface of the wiring is covered with an organic insulating film, the organic-film-covered wiring area located on the one major surface, and the organic insulating film is in contact with the wiring.

DETAILED DESCRIPTION OF THE INVENTION

Figure 1:
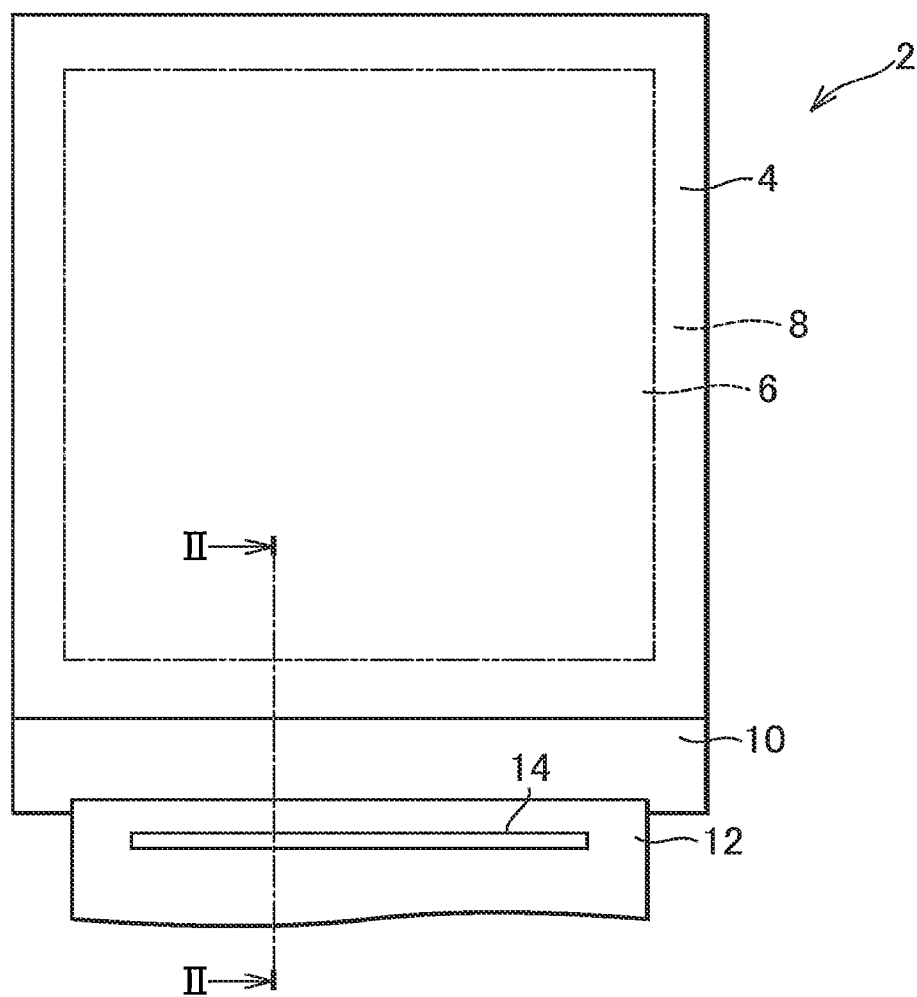
FIG. 1 is a schematic plan view of a display panel of an organic EL display device according to an embodiment of the invention.

Hereinafter, an embodiment of the invention will be described with reference to the drawings. However, the invention can be implemented in various aspects within the scope not departing from the gist thereof, and should not be interpreted as being limited to the details described in the embodiment illustrated below.

In the drawings, the width, thickness, shape, and the like of each part may be schematically represented, compared to those in practicing aspects of the invention, for more clarity of description. However, they are illustrative only and do not limit the interpretation of the invention. In the specification and the drawings, elements having functions similar to those described in relation to a previous drawing are denoted by the same reference numerals and signs, and a redundant description may be omitted.

Further, in the detailed description of the invention, the terms "on" and "below" as used in defining the positional relationship between one component and another component include, not only the case where one component is located directly on or directly below another component, but also the case where still another component intervenes between the components unless otherwise noted.

A display device according to the embodiment of the invention is an organic EL display device, and a display panel thereof is configured to be able to be curved with the use of a base material having flexibility (also referred as to a "flexible substrate") such as a resin film. Wirings are formed, in addition to display elements, on the base material such as a resin film in the display panel, and the surface of the wiring is covered with an inorganic insulating film. Here, in the flexible display, for example, a narrower picture-frame is achieved by folding a component mounting area of the display panel to the rear side of a display area as described above. When the display panel is folded to the rear side, a tensile stress acts on a layer near the outside surface (surface to be convex) at a portion including a bend (curved portion) while a compressive stress acts on a layer near the inside surface (surface to be concave). Therefore, stress basically acts also on the wiring or the insulating film thereof. Since an inorganic material film is susceptible to the tensile stress described above, cracks may occur at the curved portion in the insulating film of the wiring. Cracks reduce the insulation performance of the insulating film; in addition, stress is concentrated on the wiring in the vicinity of the crack, which increases the risk of disconnection of the wiring. In the display panel of the embodiment, a reduction in the risk of disconnection is achieved.

FIG. 1 is a schematic plan view of a display panel 2 of the organic EL display device according to the embodiment. A main substrate 4 of the display panel 2 has a rectangular shape and includes a display area 6, a picture-frame area 8, and a component mounting area 10.

Pixels are two-dimensionally arranged in the display area 6, and an OLED and a pixel circuit including a TFT and the like are formed corresponding to each of the pixels. Moreover, wirings for supplying electric signals or power necessary for the operation of the OLEDs and the pixel circuits are formed in the display area 6.

The picture-frame area 8 is located at the outer edge of the display area 6. The inside boundary of the picture-frame area 8 coincides with the outline of the display area 6, and the outside boundary has a rectangular shape. Three sides of the outside boundary are the sides of the main substrate 4, and the remaining one side is a boundary between the component mounting area 10 and the picture-frame area 8.

The component mounting area 10 is provided adjacent to the picture-frame area 8. The picture-frame area 8 and the component mounting area 10, that is, an area located outside the display area 6 is referred to as a "peripheral area". The component mounting area 10 has a rectangular shape whose three sides are the sides of the main substrate 4 and whose remaining one side is a boundary between the picture-frame area 8 and the component mounting area 10. The wiring supplying a signal to the OLED or the pixel circuit is extracted from the display area 6 to the component mounting area 10. That is, a group of wirings extracted from the display area 6 is disposed in the component mounting area 10. Moreover, connection terminals for connecting the wiring group to an external circuit are disposed in the component mounting area 10. For example, an FPC 12 is connected to the connection terminals, and the FPC 12 is connected to a drive circuit, a controller, and the like relating to the display panel 2. For example, a driver IC 14 and the like for the display panel 2 may be mounted on the FPC 12. The driver IC 14 may be disposed in the component mounting area 10 on the main substrate 4.

Figure 2A:
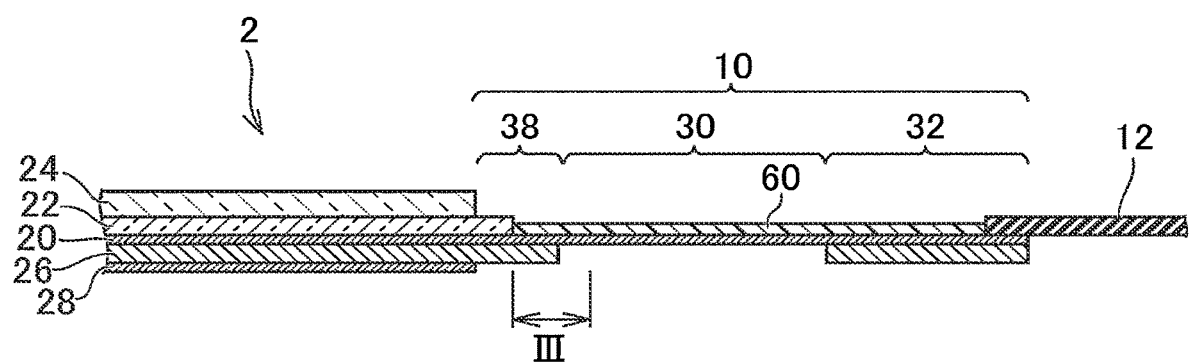
FIG. 2A is a schematic vertical sectional view of the display panel at a position along the line II-II shown in FIG. 1.
Figure 2B:
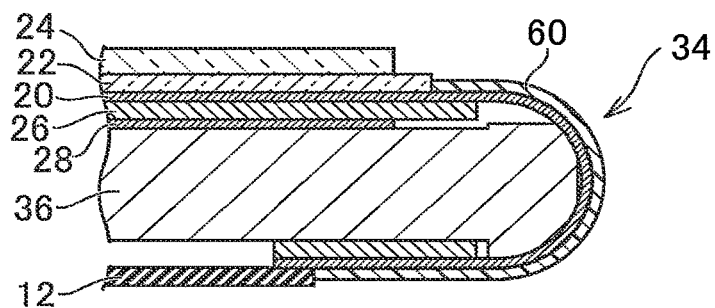
FIG. 2B is a vertical sectional view corresponding to FIG. 2A, in the state where a component mounting area and an FPC are folded back to the rear surface side of a display area.

FIGS. 2A and 2B are schematic vertical sectional views of the display panel 2 at a position along the line II-II shown in FIG. 1. FIG. 2A is a sectional view in the state where the main substrate 4 and the FPC 12 are located on the same plane as shown in FIG. 1.

The main substrate 4 includes an array substrate 20 in which a display function layer including the display elements and the wirings is formed on one major surface of the base material. The array substrate 20 includes, as the display function layer on the surface of the base material, a structure in which a layer forming the TFTs of the pixel circuits, the wirings, and the like, a layer constituting the OLEDs, a sealing layer sealing the OLEDs, and the like are stacked. The array substrate 20 is formed to be flexible using a film-like base material having flexibility. For example, a flexible insulating material such as polyimide can be used as the base material. The main substrate 4 may further include a protective film 22 and a polarizer 24, which are attached to the display surface of the array substrate 20, and a reinforcing film 26 and a thermal diffusion sheet 28, which are attached to the rear surface of the array substrate 20. As shown in FIG. 2A, a resin film 60 is disposed in a place of the array substrate 20 where the protective film 22 is not disposed. A structure may be employed in which the polarizer 24 also serves as the protective film 22. Moreover, it is also possible to employ a structure in which the thermal diffusion sheet 28 is not disposed.

The main substrate 4 is configured to be able to be curved in the component mounting area 10. With this configuration, a non-curved area 32 that is the component mounting area 10 located ahead of a curved area 30 as viewed from the display area 6, the FPC 12, and other circuit boards connected to the FPC 12 can be folded back to the rear side of the display area 6. With such folding back, the size of the display panel 2 in a plan view can be reduced, and the downsizing of an electronic apparatus on which the display panel 2 is mounted can be achieved. The component mounting area 10 includes a non-curved area 38 also in a position on the display area 6 side of the curved area 30. FIG. 2B is a sectional view in this case and is a sectional view in the state where the component mounting area 10 of the main substrate 4 and the FPC 12 are folded back to the rear surface side of the display area 6 of the main substrate 4.

Since a portion of the display panel 2 that is located ahead of the curved area 30 provided in the component mounting area 10 of the main substrate 4 is hidden at the rear surface, the ratio of the display area 6 occupying the front of the electronic apparatus can be increased. Moreover, the driver IC 14 and the like are mounted on a portion of the display panel 2 that is folded back to the rear surface, and the picture-frame area 8 appearing on the display surface side is not used as an arrangement area for a component such as an IC; therefore, the area of the picture-frame area 8 can be reduced. That is, a so-called narrower picture-frame in a display device can be progressed.

By not attaching the reinforcing film 26 to the curved area 30, the softness of the area can be increased, and thus the display panel 2 can be curved with a smaller curvature radius. As the curvature radius of a curved portion 34 shown in FIG. 2B is smaller, the size of the display panel 2 folded, in a plan view, also becomes smaller and also the thickness of the display panel 2 folded becomes smaller.

Moreover, by not attaching the reinforcing film 26 to the curved area 30, the position of the neutral plane of a bending stress in the curved portion 34 may move closer to the surface side (side on which the resin film 60 is disposed in the array substrate 20) than a portion covered with the reinforcing film 26. In the embodiment, with the fact that the reinforcing film 26 is not attached to the rear surface of the array substrate 20 in the curved area 30 and with the resin film 60 applied to and stacked on the surface of the array substrate 20 in the component mounting area 10, the position of the neutral plane of stress in the curved portion 34 is controlled to reduce the stress in the wiring layer formed on the surface of the array substrate 20, and thus the disconnection of the wiring is made less likely to occur. For example, the stress can be reduced by controlling the position of the neutral plane in the curved portion 34 to be located in the vicinity of the wiring layer. Moreover, by adjusting the position of the neutral plane such that the wiring layer is located nearer the inside surface than the neutral plane, that is, near the surface to be concave due to the curving of the display panel 2, the stress of the wiring is in the compression direction, and thus the disconnection can be made less likely to occur than in the case of a tensile stress.

A spacer 36 is disposed inside the display panel 2 folded, that is, in a gap interposed between the non-curved areas (the areas 32 and 38 shown in FIG. 2A) in the sectional view shown in FIG. 2B. The spacer 36 keeps the space of the gap at a fixed value or more. With this configuration, even when pressure in the thickness direction is applied to the display panel 2, the curvature of the curved portion 34 can be kept within the allowable range. The end portion of the spacer 36 is a curved surface with a curvature according to the back surface of the curved portion 34, and the end portion abuts on the back surface of the curved portion 34, so that the shape of the curved portion 34 can be kept constant even when pressure is applied to the surface of the curved portion 34.

Figure 3:
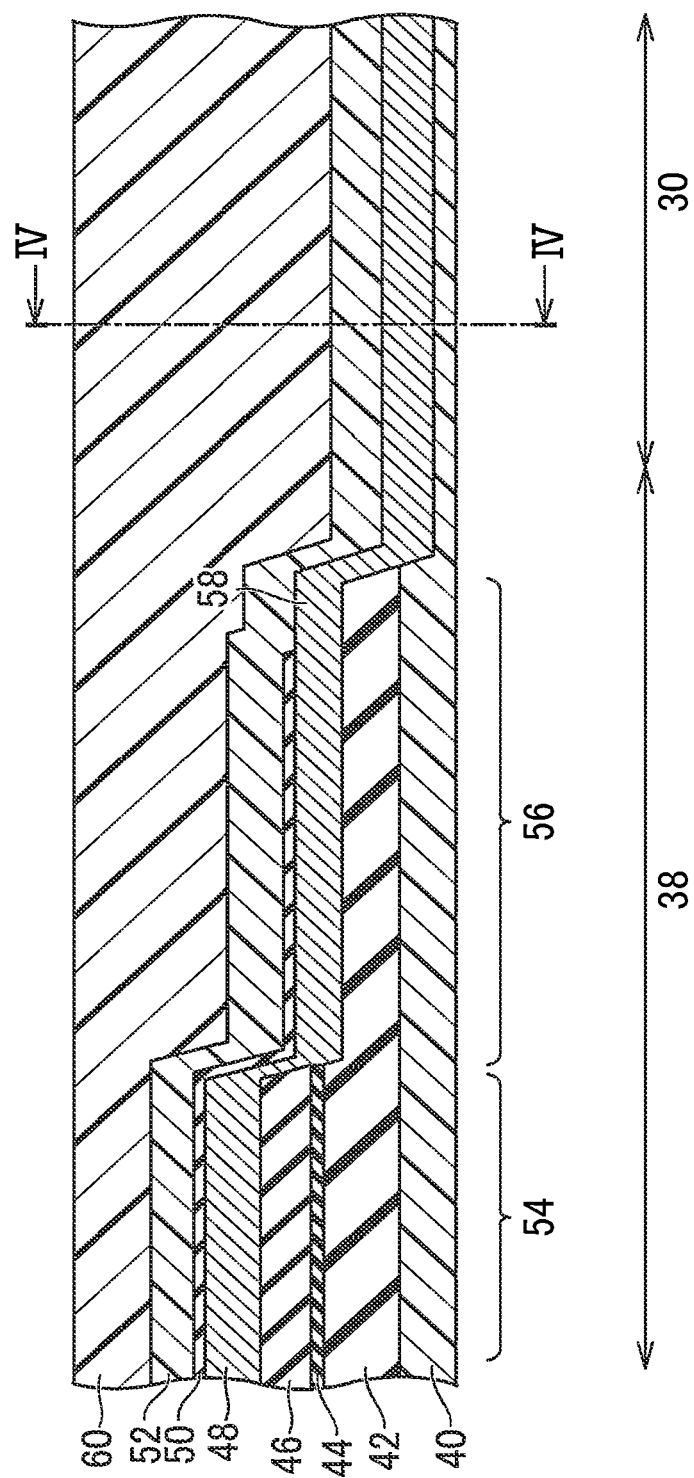
FIG. 3 is a schematic vertical sectional view of an array substrate in the area III shown in FIG. 2A.

FIG. 3 is a schematic vertical sectional view of the array substrate 20 in the area III shown in FIG. 2A. The cross-section shown in FIG. 3 includes the non-curved area 38 located on the display area 6 side of the curved area 30 and an end portion area of the curved area 30 on the display area 6 side, in the component mounting area 10.

As described above, the main substrate 4 includes the array substrate 20 in which the display function layer including the display elements and the wirings is formed on one major surface of the base material. Here, the stacked structure on the base material is referred to as the "display function layer" because the main portion thereof is a structure in the display area 6. However, films stacked in the display area 6 can be stacked also in the picture-frame area 8 and the component mounting area 10 to form structures necessary for the areas. The films stacked in the display area 6 may extend continuously from the display area 6 to the picture-frame area 8 and the component mounting area 10. Moreover, the films stacked in the display area 6 are located in the same layer in the display area 6, the picture-frame area 8, and the component mounting area 10; however, the films may be disposed not continuously but separately in the areas.

For example, an undercoat layer 42 (a first inorganic film), a TEOS film 44 (a first insulating film), an inter-layer insulating film 46 (a second inorganic film), a metal film 48, an SiN film 50 (a third inorganic film), and an organic planarization film 52 (an organic insulating film) may be stacked in the component mounting area 10 in common with the display area 6.

Specifically, the undercoat layer 42 is a layer that is stacked on the surface of the base material 40 of the array substrate 20, and is also referred to as a "foundation film". The base material 40 is a substrate having flexibility (a resin substrate or a film substrate), and is formed using, for example, polyimide. The undercoat layer 42 is formed of an inorganic film made of silicon oxide ($SiO_x$), silicon nitride ($SiN_y$), or the like, and may be a stacked structure of the materials. In the embodiment, after the undercoat layer 42 is deposited on the entire surface of the base material 40, the right side of a portion of the undercoat layer 42 that appears in FIG. 3 is removed by etching, and thus the undercoat layer 42 is patterned into the structure shown in FIG. 3. With this configuration, the undercoat layer 42 in the component mounting area 10 is stacked on a portion of the non-curved area 38 excluding the vicinity of the curved area 30. The thickness of the base material 40 is smaller in a portion where the undercoat layer 42 is removed than in a portion where the undercoat layer 42 is provided.

A semiconductor layer is stacked on the undercoat layer 42. A channel region, a source region, and a drain region of the TFT of the pixel circuit are formed of the semiconductor layer in the display area 6. After the formation of the semiconductor layer, the TEOS film 44 made of tetraethyl orthosilicate (TEOS) is stacked as a gate insulating film in the display area 6. Instead of the TEOS film, an SiO film made of $SiO_x$ can also be used.

A metal film stacked on the TEOS film 44 is patterned in the display area 6 to form a gate electrode and the like of the TFT. An inorganic film is stacked as the inter-layer insulating film 46 to cover the gate electrode and the like.

On the other hand, the TEOS film 44 and the inter-layer insulating film 46 are provided in a partial area 54 of the non-curved area 38 on the display area side in the component mounting area 10 as shown in FIG. 3. That is, the TEOS film 44 and the inter-layer insulating film 46 are located extending from the display area 6 through the picture-frame area 8 to the middle (to the area 54) of the non-curved area 38. The TEOS film 44 and the inter-layer insulating film 46 that are provided in a portion of the component mounting area 10 other than the area 54 are removed by, for example, etching. With this configuration, the surface of the undercoat layer 42 is exposed in an area 56 located on the curved area 30 side of the area 54 shown in FIG. 3.

The metal film 48 is formed on the inter-layer insulating film 46. The metal film is patterned to form the source electrode and drain electrode of the TFT and the wiring group in the display area 6. In the component mounting area 10, on the other hand, the wiring group extracted from the display area 6 and the connection terminals for connecting the wiring group to the external circuit, described above, are formed of the metal film 48.

The metal film 48 shown in FIG. 3 corresponds to one wiring 58 of the wiring group. The wiring 58 in the component mounting area 10 is extended from the display area 6 through the non-curved area 38 and the curved area 30 to the non-curved area 32 shown in FIG. 2A. Here, the wiring 58 is formed on the surface of the base material 40 in the curved area 30 as shown in FIG. 3. Since the undercoat layer 42, the TEOS film 44, and the inter-layer insulating film 46, which are located below the wiring 58, are not disposed in the curved area 30, the wiring 58 comes close to the inside surface (comes close to the base material 40 side) in the curved portion 34. With this configuration, the position of the wiring 58 can be set to the position of the neutral plane of stress or to a position on the base material 40 side of the neutral plane at which a compressive stress occurs, and thus it is possible to avoid the breakage of the wiring 58 due to a tensile stress. An area where the wiring 58 is formed on the surface of the base material 40 may partly reach a portion of the non-curved area 38 that is adjacent to the curved area 30 as shown in FIG. 3.

In the structure of the embodiment shown in FIG. 3, the distance in the thickness direction between the base material 40 and the wiring 58, that is, the thickness of the layer located between the base material 40 and the wiring 58 (the sum of thicknesses of the plurality of stacked layer) decreases in a stepwise manner from the display area 6 side of the non-curved area 38 toward the curved area 30 side. The undercoat layer 42, the TEOS film 44, and the inter-layer insulating film 46 exist below the wiring 58 (the metal film 48) in the area 54. In the area 56, on the other hand, only the undercoat layer 42 is provided below the wiring 58 (the metal film 48). The thickness of the undercoat layer 42 in the area 56 may be smaller than the thickness of the undercoat layer 42 in the area 54. Further, the wiring 58 (the metal film 48) is formed on the surface of the base material 40 in the curved area 30. That is, the distance in the thickness direction between the base material 40 and the metal film 48 is changed in three steps. As described above, the difference in the height of the foundation of the metal film 48 between the area 54 and the curved area 30 is diversified into a plurality of steps to make each of the steps small, so that the disconnection of the wiring 58 at the step portion can be made less likely to occur.

The SiN film 50 formed of $SiN_y$ is stacked on the metal film 48. The SiN film 50 in the component mounting area 10 is stacked on a portion of the non-curved area 38 excluding the right end of the area 56 in the example shown in FIG. 3. It is sufficient that the position of the end portion of the SiN film 50 is located within the non-curved area 38. That is, the end portion of the SiN film 50 may reach the area where the wiring 58 is formed on the surface of the base material 40 in the non-curved area 38, but the SiN film 50 is not formed on the wiring 58 of the curved area 30. Cracks are likely to occur due to a tensile stress in an insulating film formed of an inorganic material film such as the SiN film 50. Moreover, since a tensile stress is more likely to occur near the outside surface in the curved portion 34, the possibility of occurrence of cracks is more increased when the SiN film 50 is disposed in the curved area 30 (the curved portion 34). The crack (crack located directly on the wiring 58) of the SiN film 50 or the like may cause the breakage of the wiring 58. In the embodiment, since the inorganic material film such as the SiN film 50 is not stacked on the surface of the wiring 58 in the curved area 30, a remarkable effect of suppressing the breakage of the wiring 58 is provided.

The organic planarization film 52 planarizes the surface of the array substrate 20 in which the TFTs, the wirings, and the like are formed in the display area 6, and the OLEDs are formed on the planarized surface. In the component mounting area 10, on the other hand, the organic planarization film 52 is stacked on the surface of the SiN film 50 in an area where the SiN film 50 is formed, and the organic planarization film 52 covers the wiring 58 in an area where the SiN film 50 is not formed, as shown in FIG. 3. The organic planarization film 52 covering the wiring 58 protects the wiring 58 from various kinds of treatment in processes after the formation of the organic planarization film 52, and has the function of insulating the wiring 58 or the function of protecting the wiring 58 such as suppressing the corrosion of the wiring 58 after the completion of the array substrate 20. For example, the organic planarization film 52 is formed of a positive photosensitive organic material containing acrylic resin as a main component. Unlike the stacked structure shown in FIG. 3, the SiN film 50 may be disposed on the organic planarization film 52.

When the area where the SiN film 50 is not formed but the organic planarization film 52 covers the wiring 58 is referred to as an "organic-film-covered wiring area", at least the curved area 30 is the organic-film-covered wiring area.

Further, resin is applied to the component mounting area 10 to form the resin film 60 on the organic planarization film 52. For example, the application process of the resin film 60 is performed after mounting the FPC 12 or the IC in the component mounting area 10. By performing the application process after mounting the FPC 12 or the IC in the component mounting area 10, the connection portions thereof can be protected by the resin film 60. However, the application process may be performed before mounting the FPC 12 or the IC.

Figure 4:
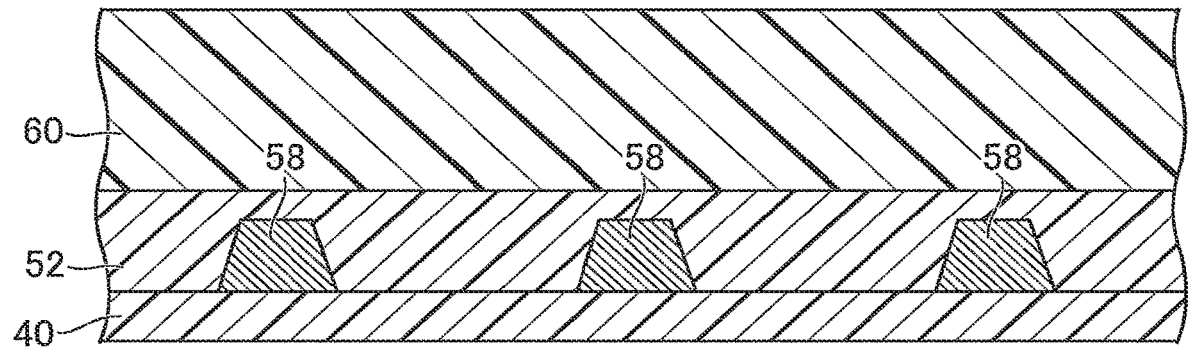
FIG. 4 is a schematic view showing an example of a vertical section structure of the array substrate in a curved area.

As previously described, in the configuration shown in FIG. 3, the undercoat layer 42, the TEOS film 44, and the inter-layer insulating film 46 are not provided in the curved area 30, but the wiring 58 is disposed on and in contact with the surface of the base material 40. FIG. 4 is a schematic vertical sectional view of the array substrate 20 in the curved area 30, showing a cross-section along the line IV-IV of FIG. 3. The wiring 58 is formed with the lower surface thereof in contact with the insulating surface of the base material 40, and the organic planarization film 52 is stacked on the wiring 58. The organic planarization film 52 covers the surface of the wiring 58, that is, the upper surface and side surfaces thereof. As described above, the organic planarization film 52 has an insulating property, has the function of insulating the wiring 58, and has the function of protecting the wiring 58. The resin film 60 is stacked on the organic planarization film 52.

The organic planarization film 52 and the resin film 60 are generally softer than an inorganic material film such as of $SiO_x$ or $SiN_y$, and, for example, are relatively less susceptible to a tensile stress when curved. Therefore, cracks due to bending are less likely to occur in the organic planarization film 52 covering the wiring 58 in the curved area 30, compared to the SiN film 50, and the disconnection of the wiring 58 is prevented. Moreover, the curved area 30 is easily bent due to the fact that an inorganic material film such as the undercoat layer 42 between the base material 40 and the wiring 58 is removed. With these configurations, the curvature of the curved portion 34 is increased to reduce the size thereof, and further reductions in the planar size and thickness of the display panel 2 can be achieved.

Figure 5:
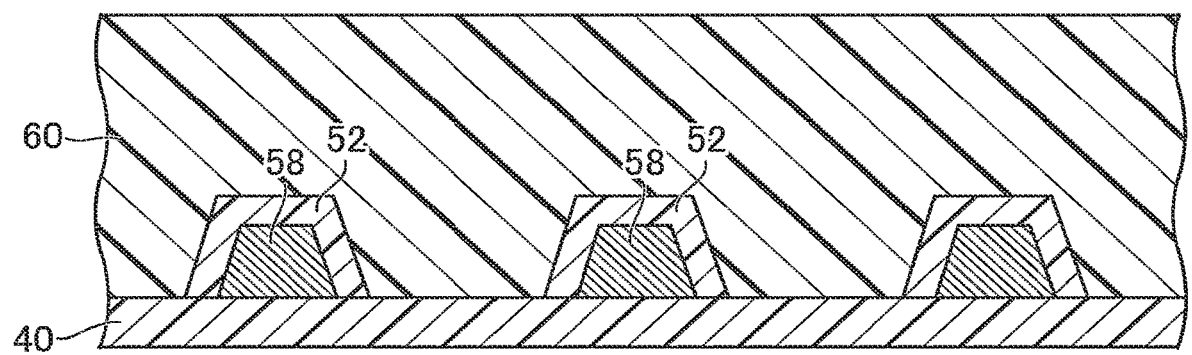
FIG. 5 is a schematic view showing another example of a vertical section structure of the array substrate in the curved area.

In the structure shown in FIG. 4, the organic planarization film 52 is continuously formed over a plurality of the wirings 58. On the other hand, the organic planarization film 52 may be formed separately for each of the wirings 58. FIG. 5 is a schematic vertical sectional view of the array substrate 20 showing the structure, showing a cross-section of the curved area 30 along the line IV-IV of FIG. 3. The wiring 58 is formed with the lower surface thereof in contact with the insulating surface of the base material 40, and the organic planarization film 52 is stacked on the wiring 58. For example, the organic planarization film 52 is formed using a photoresist, and the organic planarization film 52 between the wirings 58 is removed by a photolithography technique. With this configuration, a structure is formed in which the upper surface and side surfaces of the wiring 58 are covered with the organic planarization film 52 and the surface of the base material 40 is exposed between the wirings 58. The resin film 60 covers the surfaces of the organic planarization films 52 and the surface of the base material 40 exposed between the organic planarization films 52.

As described above, the distance in the thickness direction between the base material 40 and the wiring 58 is reduced in a stepwise manner in multiple times from the display area 6 side to the curved area 30 side, so that, compared to the case where a change in the distance is not a stepwise change, the difference in height between individual step portions, which are divided into a plurality of places and at which the distance is changed, can be reduced, and the disconnection of the wiring 58 at the step portion is less likely to occur. In the structure shown in FIG. 3, there are three areas where the distance is sequentially reduced, and therefore, two step portions are provided. The number of step portions to be provided may be three or more.

Figure 6:
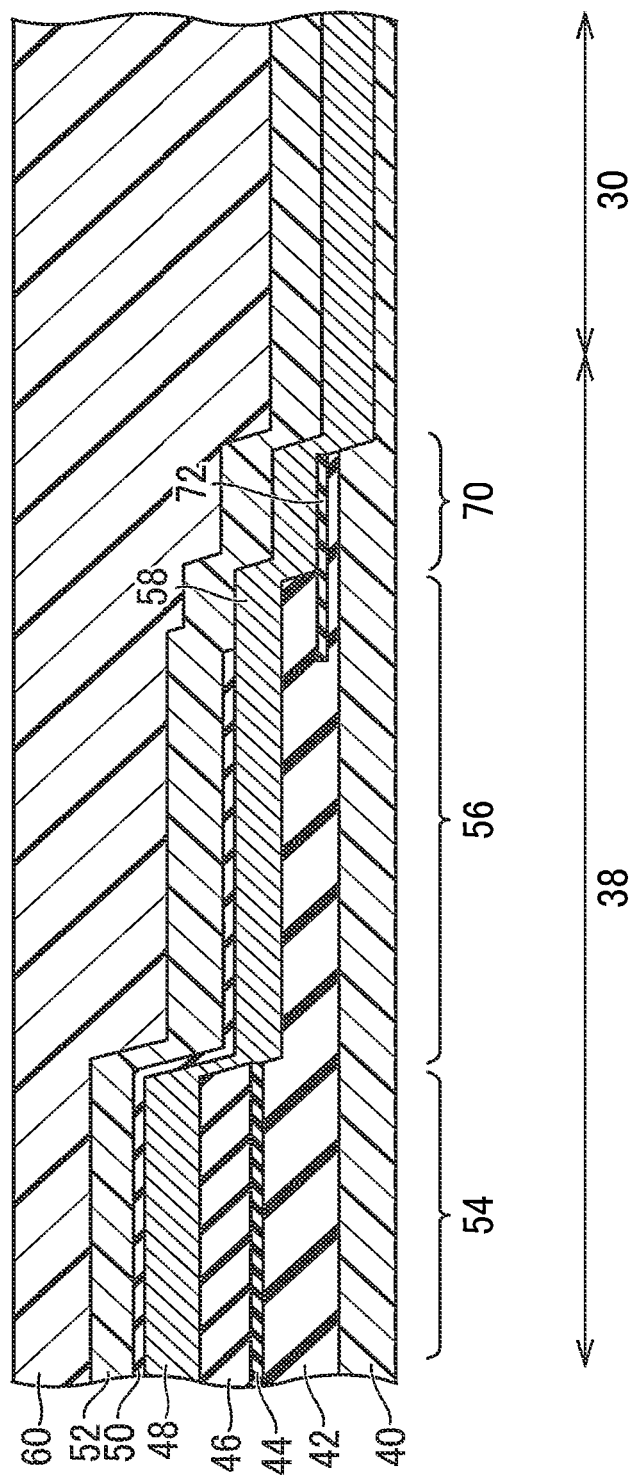
FIG. 6 is a schematic vertical sectional view of a configuration example in which the number of step portions of a foundation of a wiring in the area III shown in FIG. 2A is three.

FIG. 6 is a sectional view showing a configuration example in which three step portions are provided, and is a schematic vertical sectional view of the array substrate 20 in the area III shown in FIG. 2A, similarly to FIG. 3. In the structure of FIG. 6, the thickness of the undercoat layer 42 is thinned in a partial area 70, on the curved area 30 side, of the area where the undercoat layer 42 is left. With this configuration, in addition to the area 54 and the area 56 similar to those of the configuration of FIG. 3, an area 70 where the undercoat layer 42 thinned exists is formed in the non-curved area 38.

The structure of the area 70 can be formed by, for example, partly removing the undercoat layer 42 by etching. Specifically, an etching mask is formed on the undercoat layer 42 using a photoresist or the like, and the undercoat layer 42 in the area 70 is selectively removed by an etching treatment.

In the structure shown in FIG. 6, an etching stopper film 72 for the etching treatment is formed in at least the area 70. For example, when the undercoat layer 42 is formed of multiple layer films, the etching stopper film 72 is formed between the multiple layer films. For example, the undercoat layer 42 is formed to have a stacked structure of $SiO_2$ and SiN, and the etching stopper film 72 is disposed between $SiO_2$ and SiN. In this case, $SiO_2$ that continuously extends in the areas 54, 56, and 70 is formed; the etching stopper film 72 is provided in contact with the $SiO_2$ in the position shown in FIG. 6; and further, SiN is formed in contact with the $SiO_2$ and the etching stopper film 72. Thereafter, the SiN that is located in the area 70 is etched. In this etching process, since the etching stopper film 72 is formed, the $SiO_2$ located below the etching stopper film 72 is not etched. That is, etching of the undercoat layer 42 in the area 70 stops when reaching the etching stopper film 72. The wiring 58 is formed on the surface of the etching stopper film 72 exposed by etching in the area 70.

It is sufficient that the material of the etching stopper film 72 has high selectivity with respect to the etching of the undercoat layer 42. For example, the etching stopper film 2 can be formed of polysilicon for the undercoat layer 42 formed of $SiO_x$ or $SiN_y$. Moreover, the etching stopper film 72 can be formed of a metal film or transparent amorphous oxide semiconductor (TAOS).

In the configurations of FIGS. 3 and 6, the stacked structure on the base material 40 in the non-curved area 32 located ahead of the curved area 30 as viewed from the display area 6 can be basically common to that in the curved area 30. That is, the undercoat layer 42, the TEOS film 44, and the inter-layer insulating film 46 between the base material 40 and the wiring 58 are not stacked in the non-curved area 32, and the wiring 58 is basically formed flat from the curved area 30 to the non-curved area 32.

Figure 7:
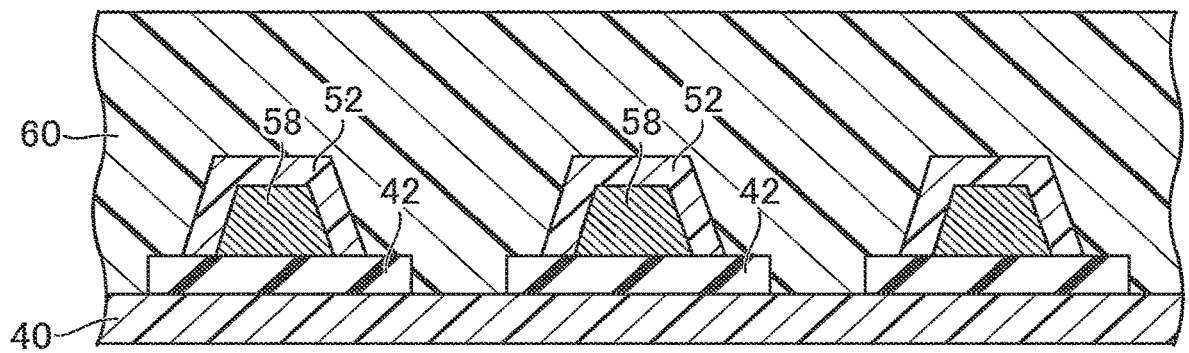
FIG. 7 is a schematic vertical sectional view of the array substrate, showing a structure in which an inorganic material film is disposed below the wiring in the curved area.

In the embodiment described above, an inorganic material film does not exist below the wiring 58 in the curved area 30. In contrast to this, a structure can be employed in which the surface of the wiring 58 formed in the curved area 30 is not covered with an inorganic material film, similarly to the embodiment described above, but an inorganic material film is disposed below the wiring 58. FIG. 7 is a schematic vertical sectional view of the array substrate 20 showing the structure, showing a cross-section, similar to FIGS. 4 and 5, in the curved area 30. The undercoat layer 42 is left corresponding to the position where the wiring 58 is formed, and the wiring 58 and the organic planarization film 52 having the structure similar to FIG. 5 are formed on the surface of the undercoat layer 42. The undercoat layer 42 is located nearer the inside surface (on the base material 40 side) than the wiring 58 in the curved portion 34, and stress on the undercoat layer 42 is basically a compressive stress. That is, cracks that are likely to occur under a tensile stress are less likely to occur in the undercoat layer 42, and the breakage of the wiring 58 is also less likely to occur.

The resin film 60 has the function of controlling the position of the neutral plane of stress described above, and also has the function of protecting the wiring 58. That is, the resin film 60 strengthens the protection of the wiring 58 by covering the top of the organic planarization film 52 protecting the wiring 58. Specifically, further suppression of the disconnection, damage, or flaw of the wiring 58 or the entry of moisture into the wiring 58 is achieved by providing the resin film 60.

On the other hand, the organic planarization film 52 is formed prior to the application process of the resin film 60, and protects the wiring 58 also before the formation of the resin film 60. Moreover, since the organic planarization film 52 is in contact with the surface of the wiring 58, the organic planarization film 52 can have the function of reducing the stress of the wiring 58 by using a material having a small thermal expansion coefficient similarly to the base material 40 when the display panel 2 or the main substrate 4 is used in a high-temperature environment or situation or in an environment or situation where the temperature changes drastically. In this regard, a photoresist film generally has a low thermal expansion rate and therefore is suitable for the organic planarization film 52.

In a structure in which the wiring 58 is protected by two layers of organic insulating films composed of the organic planarization film 52 and the resin film 60, it becomes easy to select materials for the organic insulating films to realize preferred protection. For example, the material of the organic planarization film 52 can be selected with more importance attached to a low thermal expansion rate than to the ability of preventing the entry of moisture, while the material of the resin film 60 can be selected with importance attached to the ability of preventing the entry of moisture.

In the embodiment described above, the curved area 30 of the component mounting area 10 is the organic-film-covered wiring area and achieves the protection of wiring in the curved portion. However, the protection of wiring in the curved portion with the organic-film-covered wiring area can be applied also to the case where a curved portion is provided in a portion other than the component mounting area 10 of the main substrate 4. Specifically, wirings that connect the pixel circuits or various signal lines in the display area 6 with the terminals in the component mounting area 10 pass through the picture-frame area 8. For example, the organic-film-covered wiring area can be provided and curved in the picture-frame area 8, and the picture-frame area 8 is folded to the rear surface, so that a further reduction in the size of the display panel 2 can be achieved. Moreover, the development of a display panel in which a display area itself can be bent or folded is underway. When the display panel 2 is configured as such a display panel, a curved area provided in the display area 6 may be the organic-film-covered wiring area.

The invention is not limited to the embodiment described above but can be variously modified. For example, the configuration described in the embodiment may be replaced with substantially the same configuration, a configuration providing the same operational effect, or a configuration capable of achieving the same object.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A flexible panel comprising:
a substrate having flexibility;
a pixel area including a thin film transistor arranged on the substrate;
a peripheral area located outside the pixel area;
a first inorganic film on the substrate;
a second inorganic film on the first inorganic film; and
a wiring on the second inorganic film disposed in the peripheral area,
wherein a first step portion of the substrate is arranged along an edge of the first inorganic film in the peripheral area, and
the wiring is disposed from the pixel area to the peripheral area.

2. The flexible panel according to claim 1, wherein a second step portion of the first inorganic film is arranged in the peripheral area.

3. The flexible panel according to claim 1, wherein
the substrate includes a curved portion in the peripheral area, and
the curved portion includes the first step portion of the substrate.

4. The flexible panel according to claim 1, wherein the substrate is polyimide.

* * * * *